United States Patent [19]

Keyser et al.

[11] Patent Number: 4,762,728
[45] Date of Patent: Aug. 9, 1988

[54] LOW TEMPERATURE PLASMA NITRIDATION PROCESS AND APPLICATIONS OF NITRIDE FILMS FORMED THEREBY

[75] Inventors: Thomas Keyser, Palm Bay, Fla.; Bruce R. Cairns, Los Altos Hills, Calif.; Kranti V. Anand, Sunnyvale, Calif.; William G. Petro, Cupertino, Calif.; Michael L. Barry, Palo Alto, Calif.

[73] Assignee: Fairchild Semiconductor Corporation, Cupertino, Calif.

[21] Appl. No.: 801,955

[22] Filed: Nov. 26, 1985

Related U.S. Application Data

[63] Continuation-in-part of Ser. No. 721,422, Apr. 9, 1985, abandoned.

[51] Int. Cl.$^4$ .............................................. B05D 3/06
[52] U.S. Cl. ...................................... 427/38; 427/99; 427/275; 427/294; 427/299; 427/377; 427/397.7
[58] Field of Search ............... 427/38, 99, 275, 294, 427/299, 377, 397.7

[56] References Cited

U.S. PATENT DOCUMENTS

| | | |
|---|---|---|
| 4,113,515 | 9/1978 | Kooi et al. |
| 4,292,153 | 9/1981 | Kudo et al. ........................ 427/38 X |
| 4,300,989 | 11/1981 | Chang ................................. 427/82 |
| 4,384,038 | 5/1983 | Khoe et al. ........................ 427/39 |
| 4,461,237 | 7/1984 | Hinkel et al. ..................... 427/39 |
| 4,481,229 | 11/1984 | Suzuki et al. |
| 4,522,886 | 6/1985 | Chin et al. ........................ 427/38 |

FOREIGN PATENT DOCUMENTS

58-93242 6/1983 Japan.

OTHER PUBLICATIONS

Chiu et al., "Low Energy Implantation of Nitrogen and Ammonia into Silicon".
Inoue et al., "Physical Properties of Low Energy Nitrogen Implanted Into a Silicon and Thermal Oxide".
Furumura et al., "Electrical Properties of Silicon Nitride and Silicon Oxide Thin Films Formed by the Low Energy Ion Implantation".
Fung et al., "Microstructure and Electrical Properties of Buried Silicon Nitride Layers in Silicon Formed by Ion Implantation".
Sugano, "Plasma Anodization as a Dry Low Temperature Technique for Oxide Film Growth on Silicon Substrates", Thin Solid Films, 92 (1982).
Fromhold et al., "Oxide Growth in an rf Plasma", J. Appl. Phys. 51 (12), Dec. 1980.
"Plasma Si Nitride—A Promising Dielectric to Achieve High-Quality Silicon MIS/IL Solar Cells", Hezel et al., J. Appl. Phys. 52(4), Apr. 1981, pp. 3076–3079.
Hezel et al., "Silicon Oxynitride Films Prepared by Plasma Nitridation of Silicon and Their Application for Tunnel Metal-Insulator-Silicon Diodes", J. Appl. Phys. 56(6), Sep. 15, 1984, pp. 1756–1761.

(List continued on next page.)

*Primary Examiner*—Bernard D. Pianalto
*Attorney, Agent, or Firm*—Lee Patch; James A. LaBarre

[57] ABSTRACT

A silicon nitride layer is prepared on the surface of a silicon substrate by carrying out a surface reaction on the substrate in a vacuum chamber that contains an electrode which is capacitively coupled to an rf generator. A second electrode within the chamber, or a metal wall of the chamber itself, is connected to ground. The silicon substrates to be treated are placed on one of the electrodes to be in electrical and physical contact therewith, and a reagent gas that contains nitrogen is introduced into the chamber. An rf voltage is then applied between the electrodes to ionize and activate the gas, and cause ions and other active species thereof to be directed into the silicon substrate. The nitrogen ions and other active species that are created as a result of the application of the rf power can be directed at the surface of a number of wafers simultaneously. The thin nitride films that are formed by the process have application both as barriers for device isolation and as dielectric components of electrical devices.

34 Claims, 2 Drawing Sheets

OTHER PUBLICATIONS

Hirayama et al., "Plasma Anodic Nitridation of Silicon in $N_2$—$H_2$ System, Journal of the Electrochemical Society, vol. 131, No. 3, pp. 663–666.

Bennett et al., "Selective Planarization Process and Structures", IBM Technical Disclosure Bulletin, vol. 27, No. 4B, Sep. 1984, pp. 2560–2563.

Ito et al., "(Invited) Thermal Nitridation of Silicon in Advanced LSI Processing", Japanese Journal of Applied Physics, vol. 20, suppl. 20-1, (1981), pp. 33–38.

Ito et al., "Thermally Grown Silicon Nitride Films for High Performance MNS Devices", Appl. Phys. Lett. 32 (5), Mar. 1, 1978, pp. 330–331.

LOW TEMPERATURE PLASMA NITRIDATION PROCESS AND APPLICATIONS OF NITRIDE FILMS FORMED THEREBY

CROSS-REFERENCE TO RELATED APPLICATION

This is a continuation-in-part of commonly assigned application Ser. No. 721,422 filed Apr. 9, 1985, now abandoned.

BACKGROUND OF THE INVENTION

The present invention is directed to a method of forming thin films of silicon nitrides and other nitrogen-containing compositions, such as oxynitrides, directly on a silicon surface, and is further concerned with the application of such films.

Thin films of silicon nitride have two significant applications in the field of integrated circuits. Since they exhibit a higher dielectric constant and hence a higher unit capacitance than silicon dioxide layers, their use as capacitor dielectrics in small dimension MOS circuits is preferred. The increased unit capacitance that they exhibit makes it possible to fabricate capacitors in smaller areas and hence contributes to a denser circuit, relative to a circuit of similar complexity that employs a silicon dioxide film. In addition, silicon nitride films have greater resistance to radiation, alkali ion and other impurity diffusion.

A second application of thin silicon nitride films relates to the electrical isolation of integrated circuits by means of silicon dioxide islands. Typically, these islands are formed by oxidizing selected regions of a silicon substrate. Silicon nitride films are used to protect areas of the substrate where the devices are to be fabricated. In current practice, a thin oxide layer is used between the substrate and a deposited silicon nitride film to prevent the generation of stress-induced faults during oxidation. The presence of this oxide layer permits oxidization to proceed in a lateral, or horizontal, direction as well as in the vertical direction. Oxide encroachment in this lateral direction reduces the area that is subsequently available for fabricating the integrated circuit, and it is therefore preferable to minimize such. Accordingly, attempts have been made to form the thin nitride layer directly on the silicon substrate.

In the past, several different techniques have been employed to form a silicon nitride layer directly on the surface of a silicon substrate. One such technique is the thermal nitridation of silicon, which is carried out using ammonia or nitrogen gases at temperatures in the neighborhood of 1000° C. or greater. This approach is disadvantageous in that it requires treatment at high temperatures for extended periods of time and is limited in the types of materials which can be present on or in the substrate. It is particularly unsuitable for use in the fabrication of VLSI devices, since the susceptability of dopants to diffusion at high temperatures presents problems with the small geometries that are involved. In addition, the resultant films contain a significant amount of oxygen, which hampers their effectiveness in resisting oxidation.

A variation of this technique involves plasma-assisted thermal nitridation with the use of inductively coupled reactors. This technique is disclosed, for example, in U.S. Pat. Nos. 4,277,320 and 4,298,629. A coil disposed around the reaction chamber generates an electromagnetic field that inductively heats the wafer to be coated and excites tne gas within the chamber to create a plasma. Such reactors have proven to be difficult to construct on a production-scale level, and are therefore not in widespread use. Furthermore, they operate at relatively high temperatures (close to 1000° C.) that are produced by the inductive field, and hence have high power requirements.

Another technique for forming thin nitride films uses high energy ion implantation. This technique is generally not desirable from a commercial standpoint, since its throughput is limited by the relatively small ion beam that is employed. In addition, high current implantation systems are complex and expensive.

Low energy ion bombardment is a third technique that has been used to prepare nitride-like films on silicon. Limitations associated with this technique include the fact that processing can only be carried out on a single wafer at a time because of the beam size generated by presently available low energy ion bombardment sources, and the contamination of the resulting layer with materials that are used to fabricate the ion gun source.

A fourth technique for forming silicon nitride films is low pressure chemical vapor deposition (LPCVD). Thickness control of thin films is difficult with this process, and hence the films tend to be relatively thick, in the neighborhood of 300 angstroms or more. As a result, they are not suitable for use in trench isolation when in direct contact with silicon because they can produce stress at the corners of the trench, which leads to defects in adjacent regions of the silicon substrate.

OBJECTS AND BRIEF STATEMENT OF THE INVENTION

Accordingly, it is an object of the present invention to provide a novel means for economically converting the surfaces of silicon and similar materials into nitride-like layers at relatively low temperatures, i.e. at or near room temperature. In particular, it is an object of the invention to provide a novel method for forming silicon nitride layers, which method does not require an ion gun source and minimizes the energy of ions incident on metallic surfaces, to thereby keep the sputtering and subsequent redeposition of potential contaminants onto the wafer surface low. It is a further object of the invention to provide a novel method of the foregoing type which provides effective control over the thickness of the nitride layer that is formed.

It is a further object of the invention to provide novel applications for thin nitride films.

In accordance with the present invention, these objects are achieved by carrying out a surface reaction on a substrate layer in a vacuum chamber that contains an electrode which is capacitively coupled to an rf generator. A second electrode within the chamber, or a metal wall of the chamber itself, is connected to ground. The silicon wafers to be treated are placed on one of the electrodes to be in electrical and physical contact therewith, and a reagent gas that contains nitrogen is introduced into the chamber. An rf voltage is then applied between the electrodes to create a plasma, causing ions thereof to be accelerated into the silicon substrate. The nitrogen ions that are created as a result of the application of the rf power can be directed at the surface of a number of wafers simultaneously, thereby providing improved throughput over the prior art techniques. In addition, the growth process is self limiting, thereby providing effective control over the thickness of the silicon nitride layer, enabling films that are in the range of 50-100 angstroms thick to be consistently produced.

The thin nitride films that are formed by such a method have a variety of useful applications. Because of their high degree of integrity and high nitrogen-to-oxygen ratio, they are well suited for preventing oxidation during device isolation. Furthermore, the controllability of the thickness of the films readily facilitates the fabrication of capacitors having high unit capacitance. For greater reliability and to reduce leakage currents, the films can be annealed in an oxygen atmosphere when they are to be incorporated in capacitor structures. In addition, the electrical properties of such a film, coupled with its immunity to impurity diffusion and radiation, contribute to its successful application as a gate dielectric for MOSFET devices.

Further features of the invention are described in detail hereinafter with reference to preferred embodiments thereof illustrated in the accompanying drawings.

DESCRIPTION OF PREFERRED EMBODIMENTS

Figure 1:
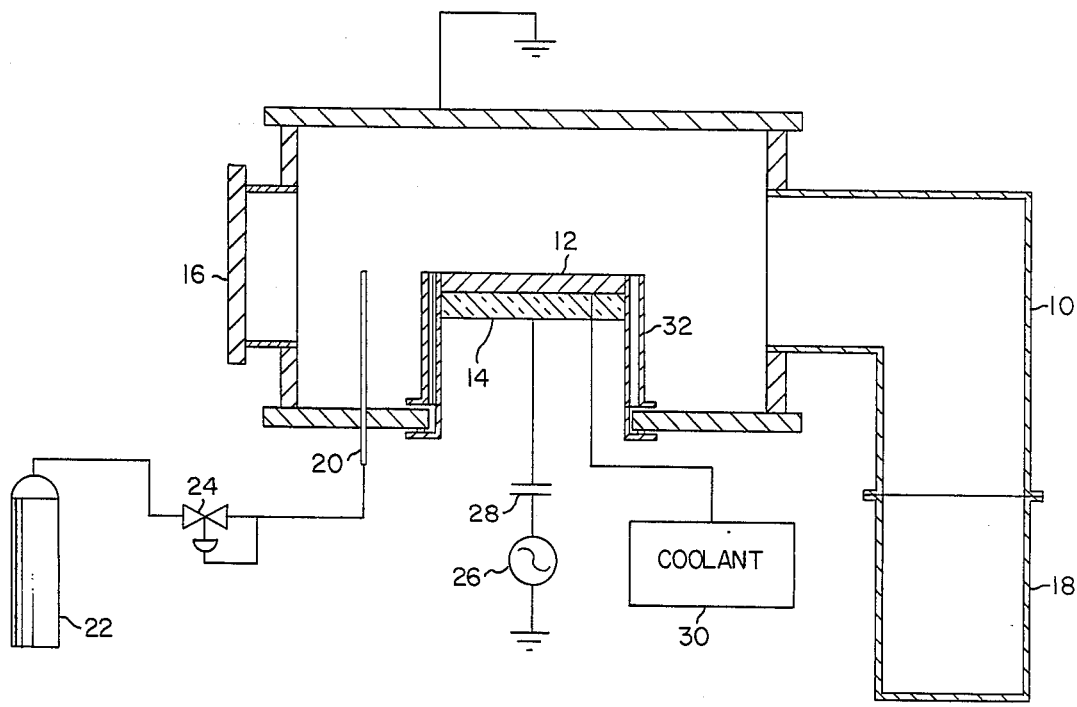
FIG. 1 is a schematic representation of a chamber of the type that can be used to implement the process of the present invention.

The method of the present invention for forming a thin film of nitride directly on the surface of a silicon substrate can be carried out in an apparatus of the type illustrated in FIG. 1. For example, this apparatus could be a chamber of the type that is typically used for plasma etching. This apparatus basically comprises a sealed metal-walled chamber 10 having a cathode 12 that is electrically insulated from the remainder of the chamber walls, for example by means of a glass insulating ring 14. One wall of the chamber is provided with a loading port 16 to enable silicon wafers to be placed on the cathode 12 and removed therefrom. A vacuum source, such as a turbo-molecular pump 18, is in communication with the chamber to thereby evacuate the same. In addition, the chamber is provided with a gas introduction tube 20 that is connected to a source 22 of a suitable nitrogen-containing gas through a pressure regulator 24. If appropriate, suitable moisture and oxygen removing cannisters (not shown) can be connected to the tube 20 to improve the purity of the gas that is introduced into the chamber.

The cathode 12 is coupled to an rf generator 26 by means of an in-line capacitor 28, and the metallic walls of the chamber 10 are connected to ground to form an anode. The cathode and the anode thus form a pair of spaced plate electrodes. The generator 26 provides an a.c. current to the cathode at an rf frequency, and the in-line capacitor 28 maintains a d.c. bias on the electrode. Preferably, the area of the anode is much greater than that of the cathode, so that a relatively high self bias, in the range of 300 to 1100 volts, is created at the cathode.

In operation, after the silicon wafers are placed on the cathode 12, and the loading port 16 is closed to seal the chamber, it is evacuated by means of the pump 18 to a low base pressure so as to minimize potentially contaminating residual gases. This base pressure is preferably about $10^{-6}$ Torr. To effect nitridation, gas from the source 22 is introduced continuously into the evacuated chamber through the tube 20 to maintain the pressure within the chamber at about $10^{-2}$ Torr. This gas could be pure nitrogen, ammonia or a nitrogen-hydrogen mixture, for example.

The gas within the chamber is activated by applying the power from the rf generator 26 to the cathode. This power can be in the range of about 25 to about 500 watts, and has a frequency of 10 KHz to 300 MHz. As a result of the rf power, a plasma of energized ions of the gas is created. These ions are accelerated into the silicon substrate that is in electrical and physical contact with the cathode, to form a silicon nitride layer.

In order to minimize heating of the silicon wafers as well as prevent cracking of the cathode due to overheating, the cathode can be cooled by any suitable arrangement, such as a water distribution system 30. To inhibit the sputtering of oxygen-containing materials from the glass insulating ring 14 that supports the electrode, a dark space shield 32 can be provided around the electrode. This shield can be made of a suitable conductive material such as aluminum or stainless steel, and can be grounded.

A capacitively coupled rf system such as that illustrated in FIG. 1 is capable of creating nitrogen-containing ions of sufficient energy and flux to the surface of the wafer supported on the cathode 12. In contrast to prior systems that employ thermal energy to induce a surface reaction, the system of the present invention utilizes electrically excited nitrogen-containing ions and accelerates them into the silicon surface to promote the chemical reaction. Since the ions can be directed at a relatively large area, a number of wafers can be processed simultaneously, thus making the method of the present invention an economic one for converting the surfaces of silicon into nitride-like layers. In addition, the process is carried out at a relatively low temperature e.g., less than 200° C. (and preferably at room temperature) and does not require an ion gun source.

Furthermore, the process provides inherent control over the thickness of the film that is formed, enabling relatively thin films that are less than 200 angstroms thick, and preferably about 50-100 angstroms thick, to be consistently produced. In particular, the process is self-limiting in that the net growth rate of the nitride film is inversely related to the film's thickness for a given power density. When the film obtains a thickness where its growth rate is equal to the constant rate at which ions sputter off its surface, the process reaches a steady state and no further net growth occurs. For example, for a power density of 0.4 W/cm$^2$ of the wafer, the thickness of the film only increases by 5% as the process time is increased from 2 minutes to 45 minutes. By adjusting the power density, films of different desired thicknesses can be obtained.

Figure 2:
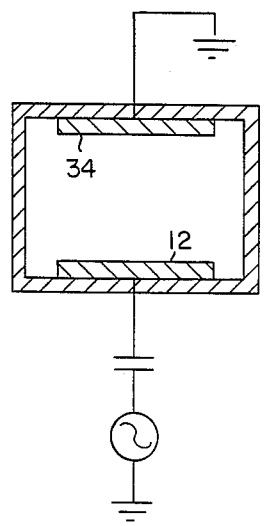
FIG. 2 is a schematic representation of an alternate arrangement for the chamber.

The chamber illustrated in FIG. 1 is electrically asymmetric, in that the ratio of the anode area to the cathode area is greater than 1, preferably at least 2:1. However, similar results can be obtained in a more symmetric two-electrode system, such as that illustrated in FIG. 2. In this system, the anode 34 and the cathode 12 are approximately equal in size and are provided on opposite walls of the chamber. In addition, the chamber need not be made of a metal, but rather can be composed of a suitable insulating material. With this arrangement, higher pressures and different rf frequencies might be employed to provide a relatively high d.c. bias voltage between the two electrodes.

The control that is afforded by the process described above and the quality of the resulting film facilitate its use in a variety of applications. Through appropriate selection of the density of the applied power (i.e. watts per $cm^2$ of the wafer), the atomic nitrogen to nitrogen-plus-oxygen ratio ([N]/[N+O]) of the film can be regulated for a desired application. For example, if the nitride film is to be used to prevent oxidation of selected areas of the wafer during field oxidation, [N]/[N+O] should preferably be at least 90%. When the plasma is formed from $N_2$, and using an anode:cathode ratio of about 20, powered by a 13.56 MHz rf generator, the [N]/[N+O] ratio can be varied in a range from about 82% (power density=0.4 $W/cm^2$) to about 98% (power density=3.2 $W/cm^2$) for 5 minutes. If $NH_3$ is used to form the plasma, the [N]/[N+O] ratio goes from about 76% to about 96% for the same respective power density settings and time.

Figure 3A:
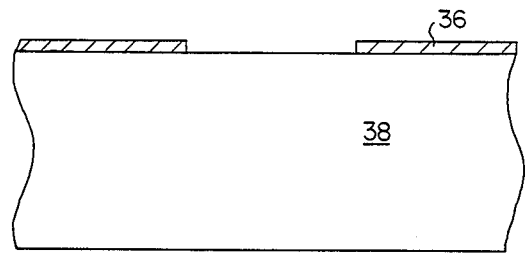
FIGS. 3a and 3b are cross-sectional views of a silicon wafer during steps of a LOCOS isolation process.
Figure 3B:
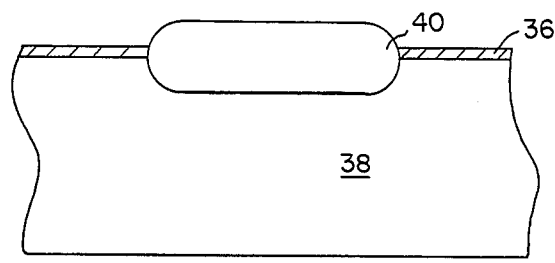

Referring to FIGS. 3a and 3b, one application of the nitride film is illustrated. After a nitride film 36 has been deposited on a silicon substrate 38 in accordance with the method described above, a portion of the film is etched away to define a field region. The portions of the film which remain define the active areas where devices are to be formed. The field regions 40 are oxidized as shown in FIG. 3b to provide isolation. The nitride film 36 protects the underlying substrate from oxidation. When the [N]/[N+O] ratio of the film 36 is at least 90%, it has been found that the film will resist more than 4500 angstroms of oxidation.

Subsequent to the formation of the nitride layer, it can be annealed if desired. Such annealing can be carried out by heating the wafer to a temperature between 900° and 1100° C. In order to prevent oxidation of the film, a chamber in which the annealing is carried out can be filled with a non-oxidizing gas such as nitrogen, hydrogen, or another inert gas. Alternatively, the chamber can be evacuated to achieve the same effect.

Furthermore, the process is not limited to the formation of thin nitride films on planar surfaces. Of particular interest in this context is the formation of the film within trenches. It has been found that high quality thin films can be formed along the side and bottom walls of trench structures in a silicon substrate. Thus, the nitride film can be used as an integral part of the insulating material that fills the trenches for dielectric device isolation.

Figure 4:
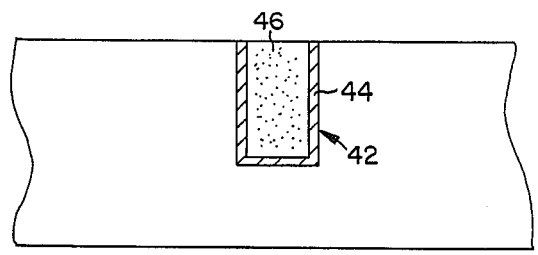
FIG. 4 is a cross-sectional view of a trench isolation structure.

Referring to FIG. 4, a trench 42 is cut into the surface of a silicon wafer to define a boundary between active areas. If desired, the trench could completely surround an active area. The side and bottom walls of the trench are lined with a thin layer 44 of nitride. Preferably, this layer is only 50-70 angstroms thick. The remainder of the trench is then filled with a suitable material 46, such as silicon dioxide or undoped polysilicon. The nitride liner 44 on the walls of the trench acts as a suitable barrier to the diffusion of the material into the silicon substrate.

Advantage can also be taken of the relatively high dielectric permittivity of the film formed according to the above-described process. In particular, silicon nitride has a higher dielectric constant than silicon dioxide. Furthermore, as the thickness of the film is reduced its capacitance increases, so that the relatively thin films that can be obtained with the present invention offer high unit capacitance. To further increase the capacitive applications of nitride films formed according to the process of the invention, they can be annealed in an oxidizing atmosphere to reduce their leakage current.

For example, when used in a dynamic random access memory (DRAM), an integrated capacitor should have high unit capacitance, e.g., at least 5 $fF/micron^2$, so as to be capable of storing a sufficiently large charge packet that provides immunity to noise. In addition, the capacitor should exhibit low leakage current, e.g., no greater than $10^{-6}$ $A/cm^2$ at 2.5 V, so as to afford a refresh cycle time of sufficient duration. The following table illustrates how the properties of a capacitor formed according to the present invention can be improved by annealing it in an oxygen atmosphere. The examples given in the table are with respect to a nitride film formed on a silicon wafer exposed to a plasma created from $N_2$ gas using an anode:cathode ratio of about 20, powered by a 13.56 MHz rf generator at a power density of 0.4 $W/cm^2$ for five minutes, in accordance with the above-described process. The oxygen anneal is carried out at 1000° C.

| Anneal Time (min) | Capacitance ($fF/micron^2$) | Leakage Current at 2.5 V ($A/cm^2$) |
| --- | --- | --- |
| 0 | * | $>10^{-5}$ |
| 30 | 8.8 | $6 \times 10^{-6}$ |
| 90 | 7.7 | $1.2 \times 10^{-7}$ |

*Not capable of precise measurement due to high leakage current.

As can be seen, the unit capacitance of the film undergoes a slight decrease when annealed, most likely due to its increased thickness and oxygen content as it undergoes oxidation. However, even with an anneal for 90 minutes, the unit capacitance still remains well above the minimum noted previously for DRAM applications, whereas the leakage current is reduced by two orders of magnitude over a film which has not been annealed.

The annealing temperature and time can be shortened, for example by utilizing steam at 900° C. for 10-15 minutes. As another alternative, it is possible to employ a rapid thermal anneal (RTA) in which high temperatures are applied to the wafer for very short periods of time, e.g., tens of seconds. It is believed that results which are equivalent to or better than those depicted above can be obtained with these alternative annealing processes.

Figure 5:
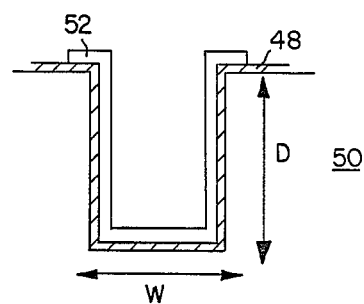
FIG. 5 is a cross-sectional view of a trench capacitor structure.

Due to the ability of the inventive process to produce high-quality nitride films within trenches, it becomes possible to fabricate trench capacitor structures. Such a structure is illustrated in FIG. 5. The capacitor basically comprises a thin nitride film 48 formed along the upper surface and within a trench formed in an appropriately doped layer 50 of silicon or polysilicon. The layer 50 functions as one electrode of the capacitor, and a second electrode 52 is formed by depositing a metal or doped polysilicon over the nitride layer 48. If the trench has a width W and a depth D, its capacitance would be (1+4D/W) times greater than that of a capacitor formed on top of layer 50 and occupying the same amount of surface area.

Another particularly useful application for nitride films formed according to the process of the present invention is as a gate dielectric for MOSFET devices. In the past, attempts at constructing a MOSFET using a thin oxide film in the gate region and a doped polysilicon for the gate conductor have met with several limitations. One of these limitations has been with respect to the impurity that is used to dope the polysilicon. Boron would be a desirable dopant for the polysilicon layer to produce an enhancement type MOSFET. However, the diffusion coefficient for boron is enhanced in the presence of hydrogen during the deposition of polysilicon. Consequently, it tends to break through the oxide layer and dope the underlying channel region. Phosphorous dopant would be another possibility but it suffers from the fact that it would create a depletion type of n-channel MOSFET.

However, by using a nitride film as the gate dielectric, the tendency of boron to diffuse into the channel region is resisted. Furthermore, even though the interface state density of the nitride film is higher than that of silicon dioxide layers, the nitride's contribution to the threshold voltage of the device is minimal, due to its small thickness and high permittivity. Therefore, it is possible to produce enhancement type MOSFETS of higher reliability and integrity using a combination of the above-mentioned features.

Figure 6:
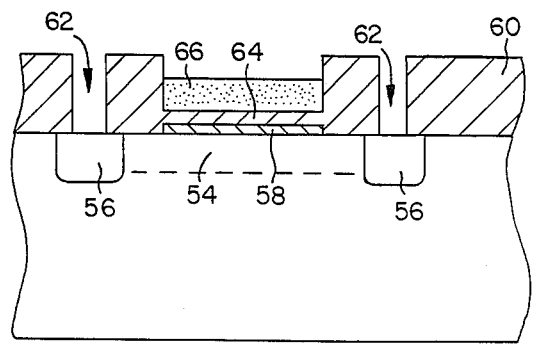
FIG. 6 is a cross-sectional view of a MOSFET device incorporating a thin nitride film in the gate dielectric.

Such a device is illustrated in FIG. 6. The device comprises a channel region 54 of silicon that is doped to one conductivity, e.g. n-type. Source and drain regions 56 of opposite conductivity are located on opposite sides of the channel region. A thin film of silicon nitride 58 is grown over the channel region to provide the gate dielectric. A silicon dioxide layer 60 covers the remaining portion of the surface of the substrate, and suitable contact holes 62 are provided for the source and drain electrodes. A thin layer of silicon dioxide 64 can also be disposed over the nitride film. In fact, the interface between the nitride layer 58 and the silicon dioxide layer 64 may not be well-defined, but rather comprise a blend from primarily nitride to primarily oxide over a distance of 5-20 angstroms. A polysilicon layer 66 that is doped with boron is deposited over the thin gate dielectric films 58 and 64 to form the gate electrode.

In summary, the nitride films that are produced according to the process of the present invention have at least two significant areas of application, as barriers for isolation and during oxidation, and as elements of electrical devices such as capacitors and MOSFETS. In the former area of application, it is desirable that the film have a high purity, i.e., [N]/[N+O] is high. Accordingly, the process should be carried out at relatively high power density levels, e.g., 1.6-3.2 W/cm$^2$, and at relatively low pressures. For electrical applications, where the film is preferably annealed in oxygen, its purity is not so much a factor as its electrical characteristics. Accordingly, the process can be carried out with lower power densities, for example in the range of 0.4-2.0 W/cm$^2$. Further in this regard, films made with N$_2$ as the source appear to be best suited for use as gate dielectrics, whereas those made with NH$_3$ are preferred for use in capacitors since they exhibit higher unit capacitance for a given leakage current.

It will be appreciated by those of ordinary skill in the art that the present invention can be embodied in other specific forms without departing from the spirit or essential characteristics thereof. The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A method of inducing a surface reaction on a silicon substrate to provide a thin film of silicon nitride or other nitrogen-containing composition on the silicon substrate, comprising the steps of:
   placing the silicon substrate in contact with one of a pair of electrodes;
   evacuating a chamber in which said electrodes and the substrate are located;
   introducing a nitrogen-containing reagent gas into the chamber; and
   applying an a.c. voltage having a frequency of about 10 KHz or greater between said electrodes to thereby ionize and activate the reagent gas and accelerate ions thereof into the substrate and thereby cause said ions to react with silicon of the substrate to form the film.

2. The method of claim 1 wherein said reagent gas comprises one of pure nitrogen, ammonia and a nitrogen-hydrogen mixture.

3. The method of claim 1 wherein said a.c. voltage is capacitively coupled to said one electrode to thereby provide a d.c. bias thereto.

4. The method of claim 1 further including the step of cooling said one electrode to inhibit heating of said substrate.

5. The method of claim 4 wherein the temperature of said substrate is less than 200° C.

6. The method of claim 1 further including the step of annealing the thin film of nitride formed on said substrate.

7. The method of claim 6 wherein said annealing step is carried out in the presence of a non-oxidizing gas.

8. The method of claim 6 wherein said annealing is carried out in the presence of oxygen.

9. The method of claim 1 wherein said one electrode comprises a plate which supports said silicon substrate in said chamber.

10. The method of claim 9 wherein said electrodes are spaced from one another and said substrate is disposed between them.

11. The method of claim 1 wherein the area of the other electrode of said pair of electrodes is at least twice as great as the area of said one electrode.

12. The method of claim 1 wherein the temperature of the substrate is maintained below 200° C.

13. A method for isolating active regions from one another in an integrated circuit, comprising the steps of:
   generating a plasma by introducing a nitrogen-containing gas between a pair of spaced plate electrodes and applying an rf frequency to the electrodes;
   placing a silicon wafer in contact with one of said electrodes to thereby cause ions of the plasma to react with silicon of the wafer and a nitride film to be formed on a surface of the wafer;
   removing select portions of said film so that the remaining portions of the film correspond to areas in which active devices are to be formed in the wafer; and oxidizing the areas on said surface of the wafer that are not covered by the remaining portions of the nitride film.

14. The method of claim 13 wherein said rf frequency signal has a power density in the range of about 1.6 to about 3.2 W/cm$^2$ of the wafer.

15. The method of claim 13 wherein said nitride film has a thickness no greater than 200 angstroms.

16. The method of claim 15 wherein said film has a thickness in the range of about 50 to about 100 angstroms.

17. The method of claim 13 wherein the ratio of nitrogen to nitrogen-plus-oxygen in said film is at least 90%.

18. The method of claim 13 further including the step of providing a d.c. bias to said electrodes.

19. The method of claim 13 wherein the pressure of said plasma is about $10^{-2}$ Torr.

20. The method of claim 13 wherein said surface of the wafer has a trench in it, and said nitride film remains in the trench after said selective removing step.

21. A method for dielectrically isolating active regions from one another in an integrated circuit, comprising the steps of:
forming a trench in the surface of a silicon wafer to define a boundary of at least one area in which an active device is to be located;
placing the wafer in contact with one of a pair of spaced plate electrodes;
introducing a nitrogen-containing gas between said electrodes;
applying an rf frequency signal to said electrodes to thereby create a nitrogen plasma and cause ions of the plasma to react with silicon of the wafer and a nitride film to be formed on said surface of the wafer and along the walls of said trench; and
filling the remainder of said trench with an insulating material.

22. The method of claim 21 wherein said film has a thickness of about 50 to about 70 angstroms.

23. The method of claim 21 wherein said rf frequency signal has a power density in the range of about 1.6 to about 3.2 W/cm$^2$ on the wafer.

24. The method of claim 21 wherein the ratio of nitrogen to nitrogen-plus-oxygen in said film is at least 90%.

25. A method of providing a dielectric film which forms a component of an electrical device in an integrated circuit, comprising the steps of:
generating a plasma by introducing a nitrogen-containing gas between a pair of spaced plate electrodes and applying an rf frequency signal to the electrodes;
placing a silicon wafer in contact with one of said electrodes to thereby cause ions in said plasma to react with silicon of the wafer and a nitride film to be formed on said wafer; and
annealing said wafer and said film in an oxidizing atmosphere.

26. The method of claim 25 wherein said rf frequency signal has a power density of about 0.4 to about 2.0 W/cm$^2$ of the wafer.

27. The method of claim 25 further including the step of depositing an electrode on the surface of said nitride film that is opposite the silicon to thereby form a capacitor.

28. The method of claim 27 wherein said nitrogen containing gas is ammonia.

29. The method of claim 25 wherein said nitride film comprises the gate dielectric for a MOSFET, and further including the step of depositing a doped polysilicon on said film to form the gate electrode of the MOSFET.

30. The method of claim 29 wherein said polysilicon is doped with boron.

31. The method of claim 29 wherein said gas is N$_2$.

32. A method for forming a film of silicon nitride on a surface of a silicon wafer by direct reaction with the silicon of the wafer, comprising the steps of:
generating a plasma by introducing a nitrogen containing gas between a pair of spaced, substantially parallel plate electrodes and applying an rf excitation voltage between the electrodes; and
disposing the silicon wafer on one of said electrodes to thereby cause ions of the plasma to react with silicon of the wafer and form the silicon nitride film on the surface of the wafer.

33. The method of claim 32 further including the step of maintaining the temperature of the wafer below 200° C.

34. The method of claim 32 further including the step of providing a d.c. bias voltage to said one electrode.

* * * * *